United States Patent [19]
Kapoor

[11] Patent Number: 5,877,045
[45] Date of Patent: Mar. 2, 1999

[54] METHOD OF FORMING A PLANAR SURFACE DURING MULTI-LAYER INTERCONNECT FORMATION BY A LASER-ASSISTED DIELECTRIC DEPOSITION

[75] Inventor: Ashok K. Kapoor, Palo Alto, Calif.

[73] Assignee: LSI Logic Corporation, Milpitas, Calif.

[21] Appl. No.: 630,267

[22] Filed: Apr. 10, 1996

[51] Int. Cl.⁶ ................................................. H01L 2/324
[52] U.S. Cl. ............................................................ 438/151
[58] Field of Search ............................................. 438/151

*Primary Examiner*—John M. Ford
*Attorney, Agent, or Firm*—Beyer & Weaver, LLP

[57] ABSTRACT

A method for depositing a planar dielectric layer between metal traces of a metallization layer of a semiconductor wafer is disclosed. A thin layer of light absorbing material is deposited on the surface of a wafer prior to the formation of metal lines on an overlying patterned metallization layer. A source of directed radiation preferentially heats the light absorbing material while the metal lines reflect the directed radiation and remain largely unheated, thereby allowing dielectric material to be evenly deposited between the metal traces. An isolation layer which insulates the metal traces from the layer of light absorbing material may be required. In some applications, the source of directed radiation is a laser source with a wavelength in the infrared range, and the light absorbing material is a material which absorbs light in this range.

6 Claims, 4 Drawing Sheets

METHOD OF FORMING A PLANAR SURFACE DURING MULTI-LAYER INTERCONNECT FORMATION BY A LASER-ASSISTED DIELECTRIC DEPOSITION

BACKGROUND OF THE INVENTION

1. Field of Invention

The present invention relates to a method of fabricating an integrated circuit. More particularly the invention relates to the use of directed radiation to selectively heat the surface of a semiconductor substrate between metal traces and thereby selectively deposit a dielectric layer between the metal traces during fabrication, forming a flat surface for further processing.

2. Description of the Prior Art

Maintaining the planarity of a semiconductor wafer surface during the process of multilevel metallization is crucial to insure that there is no accidental coupling of metal traces between different metallization layers of integrated circuits housed on the wafer, and further to provide a surface with a sufficient planarity for any subsequent optical lithography processes. There are many processes which are intended to improve the planarity of a wafer surface during fabrication.

Spin-on glass (SOG) etchback is one process commonly used to improve the planarity of a semiconductor wafer surface during the process of multilevel metallization. In the SOG etchback process, a layer of SOG is deposited over a dielectric layer on the surface of a semiconductor wafer in order to fill in any gaps between metal lines on a trace layer of the wafer. Typically, filling in the gaps between metal traces with SOG results in a planar surface on the wafer. The SOG layer is then etched back to remove all of the SOG over underlying metal traces where vias are to be placed.

The effectiveness of SOG etchback is dependent upon the underlying pattern of metal traces and gaps on a trace layer of a semiconductor wafer. For example, it has been observed that if the gaps between the metal traces are too small, voids form in the dielectric material. Once the SOG layer is etched back, the voids in the dielectric layer may be exposed, thereby compromising the global planarity of the surface of the semiconductor wafer.

A Chemical Mechanical Polishing (CMP) process is another process which is commonly used to improve planarity on the surface of a semiconductor wafer. The CMP process is implemented after a dielectric material has been deposited over a metallization layer of a semiconductor wafer. A typical CMP process involves the use of a polishing pad, made from a synthetic material, and a polishing slurry. Semiconductor wafers are mounted on a polishing fixture such that the wafers are pressed against the polishing pad under high pressure. The fixture then rotates and translates the wafers relative to the polishing pad. Wafer polishing is accomplished when the heat generated by friction between the wafer and the polishing pad causes the oxidization of some of the chemicals which comprise a dielectric layer of the wafer. Particles in the polishing slurry then abrade the oxidized chemicals away, thereby polishing the wafer.

Although the CMP process has been observed to be effective in planarizing the surfaces of semiconductor wafers, variations in planarity may still occur on wafer surfaces if the topographies of the underlying surfaces are very uneven. Further, if the gaps between adjacent metal traces are not sufficiently filled, the CMP process will not be able to planarize the surface of the wafer.

The SOG etchback and CMP procedures may add considerable cost to an integrated circuit. Both procedures require that a wafer be transferred to specialized apparatus that performs only planarization steps. The SOG etchback process requires one piece of apparatus for "spinning on" the glass and another piece of apparatus for plasma etching the glass on the wafer. The CMP process requires a special wafer platen, a polishing pad, and a chemical dispensing system. If the excess costs associated with these procedures could be reduced or eliminated, the cost of producing integrated circuits could be reduced.

FIGS. 1a and 1b are diagrammatic side views of semiconductor wafer substrates on which metal traces are situated. In FIG. 1a, the metal traces 110 are situated on a semiconductor wafer substrate 100. A coating of a dielectric material 120 is deposited over the traces 110. The metal traces 110 are spaced such that it is possible for an even coating of a dielectric material 120 to be deposited. In FIG. 1b, the metal traces 180 situated on a semiconductor substrate 160 are spaced such that there is a relatively small gap between metal traces 180b and 180c. This relatively small gap between metal traces 180b and 180c causes a void 185 to be created in the dielectric material 190 when it is deposited over the traces 180a–180f. This void 185 compromises the integrity of the layer of dielectric material 190 in that it creates a vacuum in the layer of dielectric material 190.

Although both a SOG etchback process and a CMP process have been shown to improve the planarity of semiconductor wafers, the effectiveness of both processes is largely affected by the gap-fill capabilities of dielectric materials deposited over metal traces on a trace layer of a wafer. As described above, common methods for depositing dielectric materials over a trace layer of a wafer do not serve to sufficiently fill small gaps with dielectric material. The development of a method for depositing dielectric material which can evenly fill gaps of any size between metal traces on a trace layer would greatly improve the effectiveness of processes, as for example the SOG etchback process and the CMP process previously described, intended to achieve planarity on the surface of a wafer during fabrication. Such a method may even make it possible to achieve a planar surface on a wafer without the need for costly and time-consuming processes like SOG etchback and CMP.

SUMMARY OF THE INVENTION

In accordance with the present invention, a thin layer of light absorbing material is deposited on the surface of a semiconductor wafer prior to the formation of an overlying metallization, or trace, layer in order to enable a source of directed radiation to preferentially heat the light absorbing material, thereby allowing dielectric material to be evenly deposited between the metal lines on the metallization layer. Since the process of depositing dielectric material is heat-mediated, dielectric material is only deposited on portions of the light absorbing material which are exposed between and around metal lines. This enables gaps of any size between metal traces on a trace layer to be evenly filled, thereby improving the effectiveness of subsequent planarization processes including spin-on glass (SOG) etchback and chemical mechanical polishing (CMP), and possibly eliminating the need for such processes.

A preferred method of forming a planar dielectric layer between the metal lines, or traces, of a patterned metallization layer includes the following steps. First, a layer of light absorbing material is formed on a substantially planar surface of a semiconductor wafer. The light absorbing material absorbs radiation at a defined wavelength. In some embodiments, the light absorbing material may be amorphous silicon or silicon carbide, and may be formed to a thickness of between about 100 Angstroms and 1 micrometer. Note that the light absorbing material should be chosen in conjunction, with the wavelength of the directed radiation; the band gap of the selected material is preferably of lower energy that photons of the radiation. This ensures that the radiation is absorbed and its energy used to raise the local temperature of the material. After the material is deposited, a metallization layer is formed and patterned on the layer of light absorbing material. Dielectric material then is deposited with the aid of directed radiation of the defined wavelength which is absorbed by the light absorbing material; the directed radiation locally heats the regions surrounding the metal lines while leaving the metal lines substantially unheated. Hence, dielectric material is preferentially deposited between and around the metal lines. When the light absorbing material is conductive, an isolation layer, deposited over the layer of light absorbing material prior to the formation of a patterned metallization layer, may be required to electrically isolate the metal lines from one another. The isolation layer may be formed from materials such as silicon dioxide, silicon nitride, amorphous silicon, and metal oxides in general, as for example titanium dioxide and tantalum pentoxide.

As is often the case in the art of fabricating semiconductors, more than one patterned metallization layer may be required. The process of depositing a layer of light absorbing material prior to forming a patterned metallization layer may be repeated for each patterned metallization layer required. An overlying layer of dielectric material may be deposited on top of the metal lines of each patterned metallization layer. This overlying layer caps the metallization layer so that the top surfaces of the metal lines are not exposed. Preferably, this overlying layer of dielectric material is deposited using conventional methods, i.e. it is deposited without the aid of directed radiation.

The directed radiation of a defined wavelength which is used to aid in depositing dielectric material may be provided by a laser with a wavelength in the infrared range. In some embodiments, the step of depositing dielectric material on a wafer is performed in a chemical vapor deposition (CVD) reactor. In some cases, the concentration of gaseous species in the CVD reactor may be adjusted during the step of depositing dielectric material on a wafer to ensure that deposition proceeds smoothly as wafer surface conditions change.

The CVD reactor used for forming a planar dielectric layer between metal lines of a patterned metallization layer includes a chamber used both to hold a wafer in place during the deposition process, and to contain one or more gaseous species used for depositing a dielectric layer on a wafer. The CVD reactor also includes the source of directed radiation. As recited above, in some embodiments, the source of directed radiation may be a laser with a wavelength in the infrared range. Preferably, the source of directed radiation is scanned over the wafer with the aid of a control system. In some embodiments, the control system directs the source of radiation such that the directed radiation moves across the wafer in a rasterizing motion.

These and other features and advantages of the present invention will be presented in more detail in the following detailed description of the invention and in the associated figures.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

Figure 2:
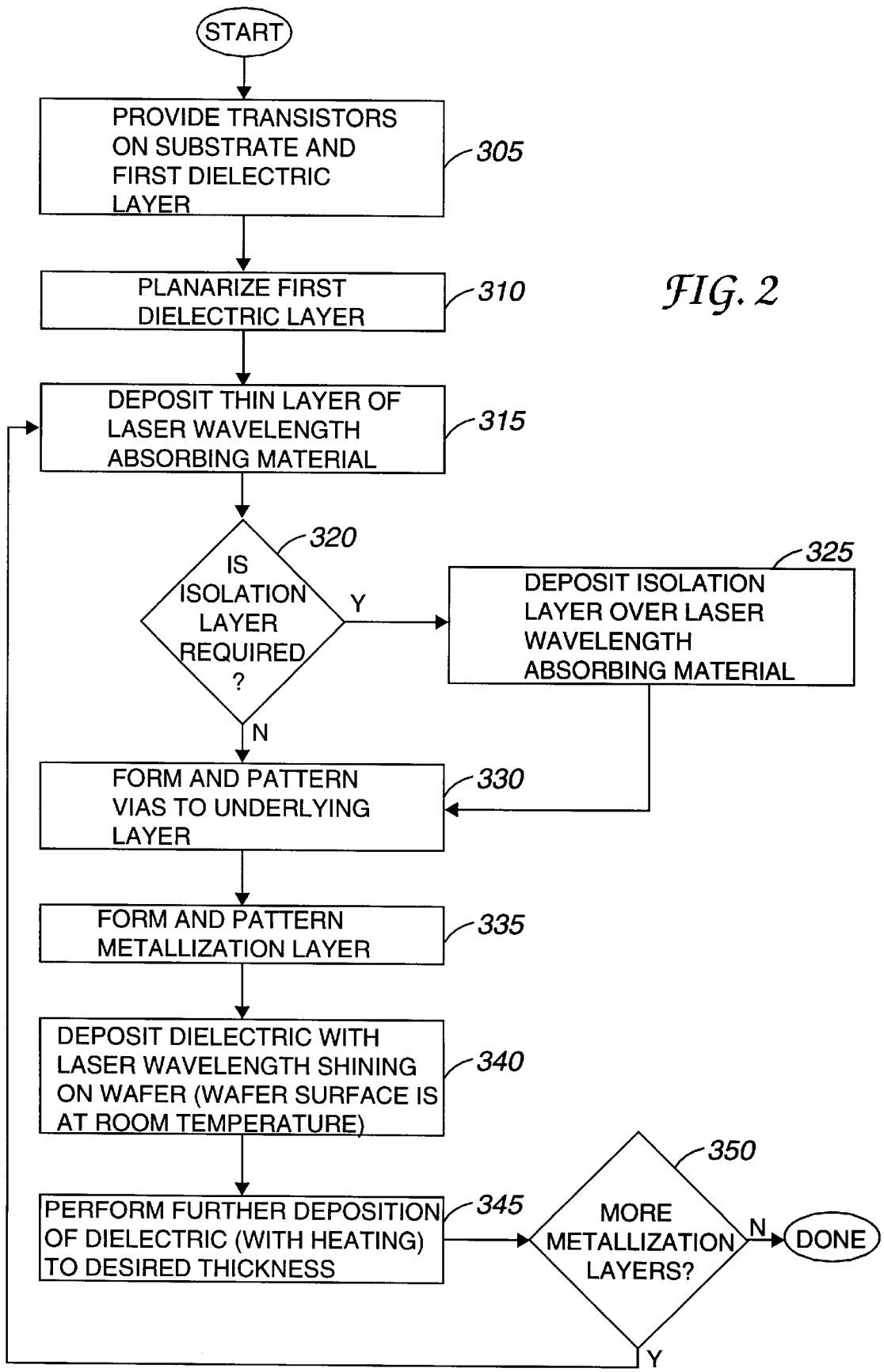
FIG. 2 is a process flow diagram in accordance with a preferred embodiment of the present invention.

The present invention will now be described in detail with reference to a few preferred embodiments thereof as illustrated in the accompanying drawings. Referring initially to FIG. 2, there is shown a process flow diagram in accordance with the preferred embodiment of the present invention. Initially, a substrate of a semiconductor wafer is provided with transistors and a first dielectric layer, as described in step 305. The first dielectric layer is intended to electrically isolate the transistors on the substrate of the wafer. The first dielectric layer is then planarized in step 310 using conventional planarization techniques. Conventional planarization techniques include an etching of the dielectric material or a process such as Chemical Mechanical Polishing (CMP).

After the planarization process of the first dielectric layer is complete, a thin layer of light absorbing material is deposited over the first dielectric layer as described in step 315. More specifically, the light absorbing material should strongly absorb radiation of a wavelength associated with a chosen light source (preferably an infrared laser). The purpose of providing a light absorbing material is to enable a beam of laser light, once metallization layers are patterned in subsequent steps to be described later, to heat the material and not the metal traces. In the preferred embodiment, the light absorbing material may be amorphous silicon or silicon carbide. Preferably, the chosen material will have a bandgap smaller than that of silicon dioxide in order for it to absorb the infrared radiation emitted by a beam of laser light. The thickness of the layer of light absorbing material is dependent upon factors such as the temperature required at the surface of the layer and the thermal properties of the light absorbing material. For many of the materials used with this invention, the light absorbing material is formed to a thickness of between about 100 Angstroms and 1 micrometer.

Depending upon the actual light absorbing material chosen, it may be necessary to form an isolation layer over the layer of light absorbing material. The isolation layer insulates the light absorbing material from the metallization layer formed over it, and may be required in the event that the light absorbing material is somewhat conductive (e.g., amorphous silicon). The isolation layer may also act as a diffusion barrier to block reactive materials from the light absorbing material from reaching the metal traces on the metallization layer. If it is determined in step 320 that the isolation layer is necessary, the isolation layer is deposited over the layer of light absorbing material as described in step 350. The isolation layer is formed from a dielectric material; in the preferred embodiment, the dielectric material may be silicon dioxide, silicon nitride, amorphous silicon, or metal oxides in general, as for example titanium dioxide or tantalum pentoxide. The isolation layer should be sufficiently thin that it does not block light absorption by the underlying layer of light absorbing material and conducts heat effectively to the surface.

If an isolation layer is not required, the process proceeds from step 320 directly to step 330. If, on the other hand, an isolation layer is required, the process proceeds to step 330 only after the isolation layer is deposited in step 325. In step 330, vias to the underlying transistors are patterned and formed to enable electrical connections to be made to the underlying transistors. Once the vias are formed, they may be filled with tungsten or aluminum according to a conventional process. Regardless of whether tungsten plugs are employed, a metallization layer is formed and patterned in step 335. If an isolation layer was required, the metallization layer is formed directly over the isolation layer. Otherwise, the metallization layer is formed directly over the thin layer of light absorbing material.

Figure 3:
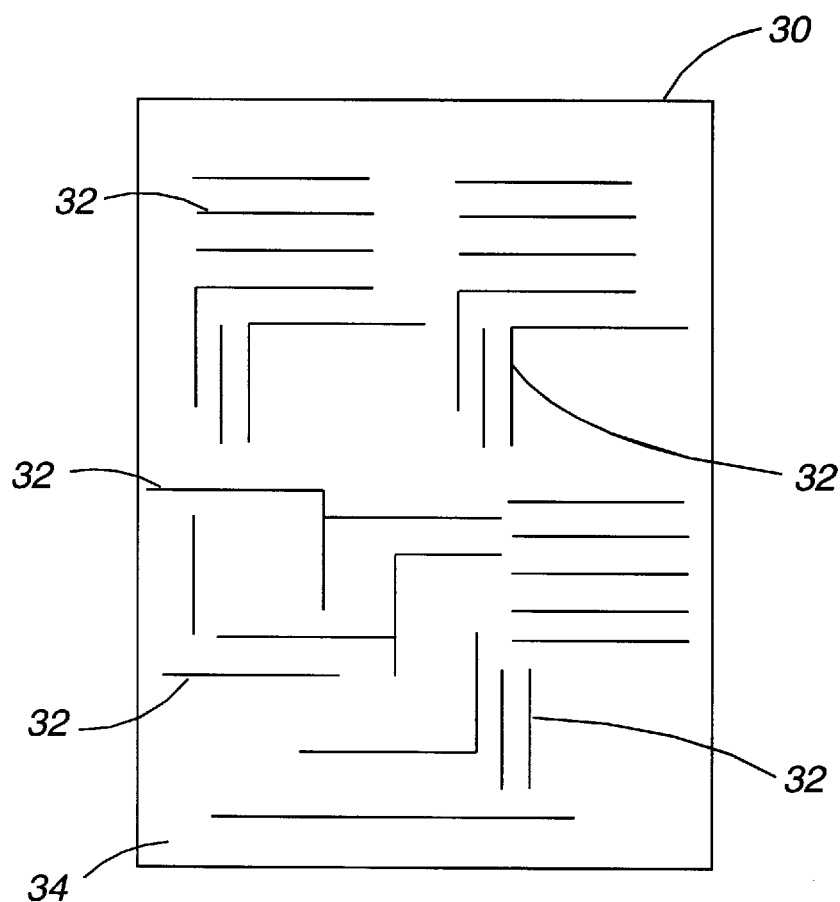
FIG. 3 is a diagrammatic top view of the surface of an integrated circuit with metal traces.

Attention is now directed to FIGS. 3 and 4a–4c so that the invention may be understood in terms of certain wafer structures. FIG. 3 is a diagrammatic top view of an integrated circuit 30 formed in accordance with a preferred embodiment of the present invention. The surface of the integrated circuit 30 contains metal traces 32, or metal lines, patterned on a metallization layer. Herein, the terms metal lines and metal traces will be used interchangeably. Although a typical integrated circuit has a high density of metal traces, it should be appreciated that the density of the metal traces 32 on the integrated circuit 30 is shown as being relatively low purely for illustrative purposes. Portions of the layer of light absorbing material 34 are visible between and around the metal traces 32. If an isolation layer were necessary, it would be overlaid on the layer of light absorbing material 34, prior to the formation of the metallization layer which contains the metal traces 32, as previously described with reference to steps 320–335 of FIG. 2.

Figure 4A:
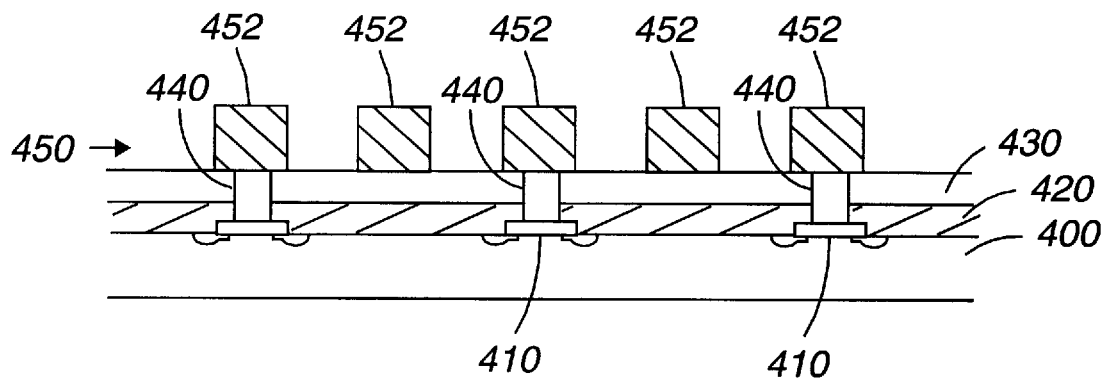
FIGS. 4a–c are diagrammatic side views of a wafer segment illustrating a dielectric planarization process in accordance with a preferred embodiment of the present invention.

FIG. 4a is a diagrammatic side view of the substrate of a wafer formed in accordance with the preferred embodiment of the present invention. Transistors 410 are provided on a substrate of a wafer 400 as previously described with reference to step 305 of FIG. 2. A first dielectric layer 420 is deposited over the transistors 410 to electrically insulate the transistors 410. The dielectric layer is then planarized using conventional techniques. A thin layer of light absorbing material 430 is deposited over the planarized first dielectric layer 420 as described earlier with reference to step 315 of FIG. 2. Vias 440 are formed and patterned to provide electrical connections from overlying metallization layers (as for example metallization layer 450) to the transistors 410. A metallization layer 450 is formed and patterned to produce metal traces 452. In this embodiment, no isolation layer is shown between the light absorbing material 430 and the metallization layer 450. However, if an isolation layer had been necessary to prevent reactions between the layer of light absorbing material 430 and the metal traces 452, an isolation layer would have been placed over the layer of light absorbing material 430 prior to the formation of the vias 440.

Referring back to FIG. 2, once the metallization layer is formed and patterned, a dielectric material is deposited with the aid of a directed source of radiation of a wavelength as described in step 340. The directed source of radiation with a laser wavelength serves to heat the thin layer of light absorbing material while the wafer surface is held at an ambient temperature, i.e. room temperature. In order to deposit the dielectric material with the aid of light with a laser wavelength, the wafer is placed into a specialized chemical vapor deposition (CVD) reactor. The chamber of the CVD reactor contains a composition of gaseous species used to deposit a dielectric layer on a wafer. It also serves to physically hold the wafer and to maintain an ambient temperature in the chamber. In the preferred embodiment, a laser source, or a source of directed radiation with a wavelength in the infrared range, is mounted in the chamber. The laser source is positioned by a control mechanism which moves the laser source in a rasterizing motion, so that radiation from the laser source is moved back and forth over the wafer.

When the laser source is moved back and forth over the wafer, the layer of light absorbing material heats up, while the pattern of metal lines reflects the laser light and remains substantially unheated. Since typical deposition processes are heat-mediated, dielectric material is only deposited on surfaces which are heated. It follows that since the laser source heats up only the light absorbing material on the surface of the wafer and leaves the metal traces largely unaffected, dielectric material will only be deposited on portions of the light absorbing material which are exposed between and around the metal traces.

Referring again to FIG. 3, laser radiation directed onto integrated circuit 30 will be selectively absorbed by the light absorbing material 34 only in those regions outside of metal traces 32. Light striking the metal traces will be reflected. Thus, only those regions of light absorbing material 34 lying outside of traces 32 will be heated.

Figure 4B:
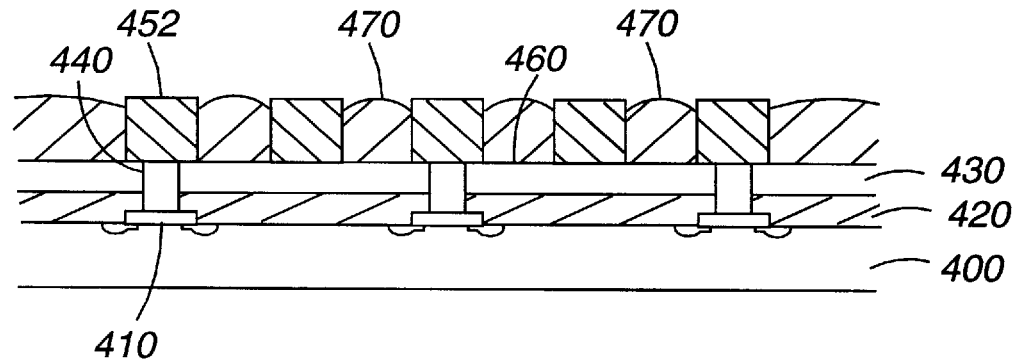

FIG. 4b is a diagrammatic side view of the substrate of a wafer in which dielectric was deposited in accordance with the preferred embodiment of the present invention. As previously described with reference to FIG. 4a, a layer of light absorbing material 430 is deposited over a first dielectric layer 420 which electrically insulates the transistors 410 on the surface of a substrate 400. The substrate 400 is placed in a specialized CVD reactor chamber which is unheated and includes a laser light source. The laser is directed at the substrate 400. This process of using a laser light source to aid in the process of depositing dielectric material will herein be referred to as a laser-assisted deposition process. The layer of light absorbing material 430 heats up as it absorbs the laser light, while the metal traces 452 on the metallization layer 450 reflect the laser light and remain unaffected by the laser light. When the layer of light absorbing material 430 is heated, dielectric material 470 is deposited over the layer 430 in gaps 460 between the metal traces 452.

Figure 1A:
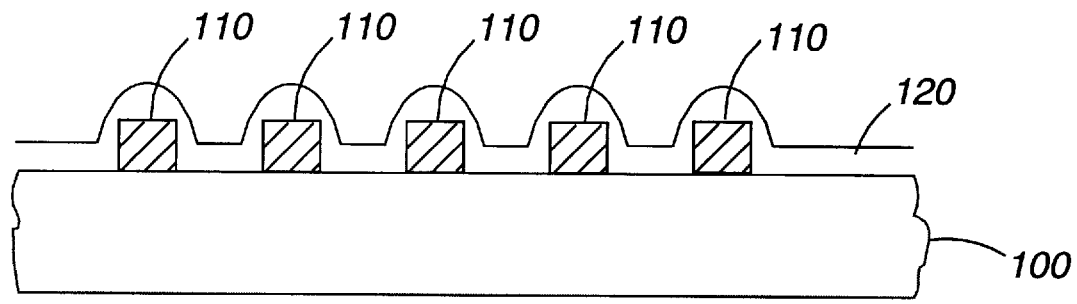
FIGS. 1a and 1b are diagrammatic side views of a wafer segment illustrating metal traces on a trace layer over which a dielectric material has been deposited.
Figure 1B:
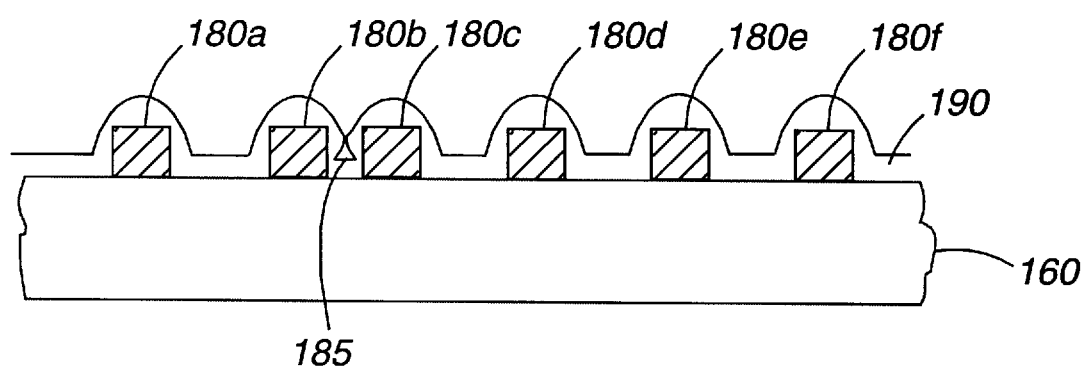

The laser-assisted deposition process which selectively heats the light absorbing material results in the elimination of voids which can form between metal traces which are spaced too closely. The formation of voids was previously described with reference to FIG. 1b. The voids are eliminated because the metal traces 452 are largely unheated, whereas the layer of light absorbing material 430 is heated. This enables the dielectric material 470 to be deposited evenly, no matter how large or small the gaps 460 between metal traces may be. Voids are eliminated because the dielectric material does not deposit on the metal traces 452 and bridge across small gaps, thereby creating voids, when the metal traces 452 are unheated. It should be understood that in conventional processes, the entire wafer, including the metal lines, is heated.

As the gaps 460 between metal traces 452 are filled up, i.e. as the "layer" of dielectric material 470 thickens, a temperature gradient in the dielectric material 480 forms. The heat emanating from the layer of light absorbing material 430 becomes less pronounced on the surface of the dielectric material 470 as the "layer" of dielectric material 470 thickens. This is because the distance the heat must travel from the thin layer of laser absorbing material to reach the surface of the dielectric material 470 also increases. As such, the temperature on the surface of the dielectric material 470 decreases as the thickness of the dielectric material 470 increases. Since the deposition process is heat-mediated, the temperature gradient in the dielectric material 470 affects the amount of dielectric material 470 which may subsequently be deposited. For each type of dielectric material chosen for a deposition process, there is a correlation between the temperature of the surface on which the material is to be deposited and the concentration of the gaseous species in a CVD reactor chamber which are used to deposit dielectric material. Thus, in accordance with this invention, the concentration of the gaseous species used to deposit dielectric material may be adjusted as the deposition process proceeds, in order to compensate for changes in the temperature of the surface on which the dielectric material is being deposited.

The deposition process may be calibrated to determine the parameters necessary for the surface of the dielectric material 470 to come up to a desired level. In the preferred embodiment, it is desired that the surface of the dielectric material 470 be level with the top surfaces of the metal traces 452. A process of trial and error may be used to determine, among other factors, the appropriate length of time for the deposition process and the concentration of gaseous species to use at different points in the deposition process to achieve the desired level for the surface of the dielectric material. As is known to those of skill in the art various "probe" techniques may be employed to monitor the dielectric thickness. For example, an interferometer may be used for this purpose.

Referring again to FIG. 2, step 345 involves the further deposition of dielectric material to achieve a desired thickness of a dielectric layer which overlies both the metal lines and the dielectric material which was previously deposited, with the aid of laser light, in step 340. This overlying dielectric layer is deposited by conventional methods after the gaps between metal traces are sufficiently filled during the laser-assisted deposition process. As noted, conventional deposition methods require that the entire wafer be heated for the deposition process. Preferably, the specialized CVD reactor chamber described above includes a heater placed beneath the wafer; this heater may be powered down during the laser-assisted deposition process described in step 340, and powered up only for conventional deposition processes.

Figure 4C:
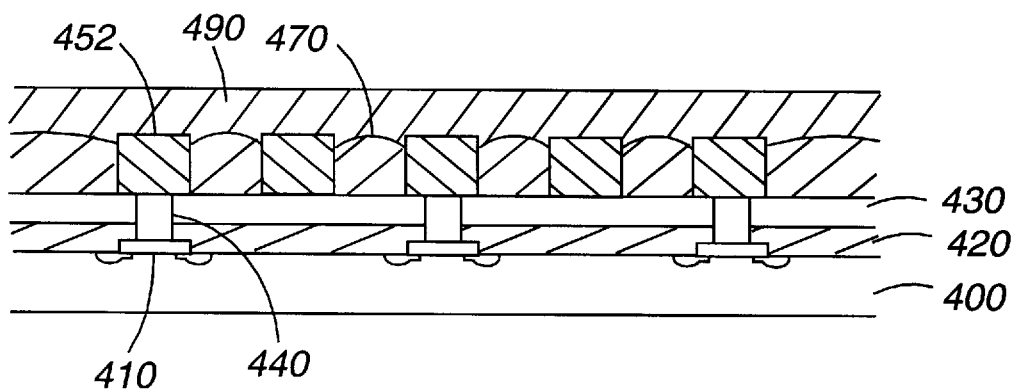

FIG. 4c is a diagrammatic side view of the substrate of a wafer in which an overlying dielectric layer is formed as described above in accordance with the preferred embodiment of the present invention. As previously described with reference to FIG. 4b, gaps 460 between metal traces 452 on the substrate 400 of a wafer are filled with a dielectric material 470. Once the gaps 460 are sufficiently filled, an overlying layer of dielectric material 490 is deposited to a desired thickness using conventional deposition methods which require that the entire substrate 400 be heated. The overlying layer of dielectric material 490 serves to electrically insulate the metallization layer 450 from any additional overlying metallization layers which may subsequently be formed. Given that all of the gaps 460 between the metal traces 452 have been filled to the level of the metal traces 452, the overlying layer of dielectric material 490 may be sufficient to provide a planar surface on the overall wafer without the use of conventional planarizing techniques such as a spin-on glass (SOG) etchback process and a chemical mechanical polishing (CMP) process. At the very least, even if it is determined that a conventional planarizing technique is desirable, the benefit of the laser-assisted deposition stems from the fact that the process leaves no voids in the dielectric material 470 between metal traces 452. The elimination of voids improves the effectiveness of both SOG etchback and CMP processes. In the preferred embodiment, the overlying layer of dielectric material 490 is sufficiently planar, and does not require additional planarizing processes.

Referring once again to FIG. 2, at step 350, a determination is made as to whether or not more metallization layers are required on the wafer. If more metallization layers are required, the process returns to step 315 where a thin layer of light absorbing material is deposited over the dielectric layer which overlies the previously formed metallization layer. Steps 315–350 are repeated until no additional metallization layers are required. When no additional metallization layers are required, the wafer fabrication process for forming metal layers is completed.

Semiconductor wafers and integrated circuits formed using the method described above with reference to FIG. 2 are distinct from conventional wafers in that they have a thin layer of laser absorbing material between at least some of the dielectric layers and metallization layers on a wafer. If required, the existence of an isolation layer, as previously described, further represents a unique characteristic of wafers and integrated circuits formed in accordance with the preferred embodiment of the present invention.

Although only one preferred embodiment of the present invention has been described, it should be understood that the present invention may be embodied in many other specific forms without departing from the spirit or the scope of the invention. In particular, the embodiments described above employ a source of directed radiation which is a laser source with a wavelength in the infrared range to preferentially heat a thin layer of light absorbing material on a wafer. It should be appreciated that the wavelength of both the source of directed radiation and the absorption band of the thin layer of light absorbing material described above may be adjusted as long as the source of directed radiation is capable of selectively heating the thin layer of material while leaving metal traces on the wafer substantially unaffected. Therefore, the above-described embodiments are to be considered as illustrative and not restrictive, and the invention is not to be limited to the details given herein, but may be modified within the scope of the appended claims.

I claim:

1. A method of depositing a dielectric layer between metal lines of a patterned metallization layer, the method comprising the following steps:

(a) providing a wafer having a substantially planar surface;

(b) forming said patterned metallization layer to define said metal lines on said substantially planar surface;

(c) selectively heating regions of said wafer lying between said metal lines while the metal lines remain substantially unheated; and (d) preferentially depositing the dielectric material in the heated regions lying between said metal lines.

2. The method of claim 1 wherein the step of depositing the dielectric material is performed in a chemical vapor deposition reactor.

3. The method of claim 2 further including adjusting a concentration of gaseous species in said chemical vapor deposition reactor during said step of depositing a dielectric material.

4. A method of depositing a dielectric layer between metal lines of a patterned metallization layer, the method comprising the following steps:

(a) providing a wafer having a substantially planar surface;

(b) forming a layer of amorphous silicon on said substantially planar surface;

(c) forming a metallization layer on said layer of amorphous silicon;

(d) patterning said metallization layer to form metal lines;

(e) directing infra-red radiation onto said amorphous silicon, wherein the metal lines remain substantially unheated, while the amorphous silicon is heated; and (f) chemically vapor depositing a material having dielectric properties, whereby the material having dielectric properties is preferentially deposited in the regions between the metal lines.

5. A method as recited in claim 1 further including forming a layer of light-absorbing material on said substantially planar surface prior to forming the patterned metallization layer to define the metal lines.

6. A method as recited in claim 5 wherein the light-absorbing material is amorphous silicon.

\* \* \* \* \*